(12) United States Patent
Huang et al.

(10) Patent No.: US 10,185,004 B2
(45) Date of Patent: Jan. 22, 2019

(54) THERMAL RADIATION SHIELD FOR SUPERCONDUCTING MAGNET, SUPERCONDUCTING MAGNET AND MAGNETIC RESONANCE IMAGING DEVICE

(71) Applicant: Siemens Shenzhen Magnetic Resonance Ltd., Shenzhen (CN)

(72) Inventors: Li Kai Huang, Shenzhen (CN); Edward Wedderburn Kershaw, Oxon (GB); Nicholas Mann, Compton (GB); Hai Tao Xiu, Shenzhen (CN); Bu Qing Zhang, Shenzhen (CN)

(73) Assignee: Siemens PLC, Camberley (GB)

( * ) Notice: Subject to any disclaimer, the term of this patent is extended or adjusted under 35 U.S.C. 154(b) by 385 days.

(21) Appl. No.: 14/991,271

(22) Filed: Jan. 8, 2016

(65) Prior Publication Data

US 2016/0202332 A1    Jul. 14, 2016

(30) Foreign Application Priority Data

Jan. 8, 2015   (CN) .......................... 2015 1 0007271

(51) Int. Cl.
*G01V 3/00*     (2006.01)
*G01R 33/38*    (2006.01)
*H01F 6/04*     (2006.01)
*G01R 33/3815*  (2006.01)

(52) U.S. Cl.
CPC .......... *G01R 33/3804* (2013.01); *H01F 6/04* (2013.01); *G01R 33/3815* (2013.01)

(58) Field of Classification Search
CPC .. A61B 5/055; G01R 33/5608; G01R 33/543; G01R 33/385; G01R 33/5659

USPC .......................................................... 324/322
See application file for complete search history.

(56) References Cited

U.S. PATENT DOCUMENTS

| 4,989,748 A | * | 2/1991 | Parr, Jr. .................. | A47G 19/26 219/734 |
|---|---|---|---|---|
| 6,061,870 A | * | 5/2000 | Dodge .................... | A63C 10/04 16/2.1 |
| 8,941,272 B2 | | 1/2015 | Hong | |
| 2006/0266053 A1 | | 11/2006 | Jiang et al. | |
| 2010/0200594 A1 | | 8/2010 | Husband et al. | |
| 2011/0284191 A1 | | 11/2011 | Jiang | |

(Continued)

FOREIGN PATENT DOCUMENTS

JP    WO2013150951 A1    12/2015

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

A thermal radiation shield for a superconducting magnet has an inner tube, an outer tube arranged around the periphery of the inner tube, and an annular end cap disposed therebetween, and connected in a fixed manner to an edge of the inner tube by an inner edge of the annular end cap. A first toothed part is formed at an outer edge of the annular end cap, the first toothed part being connected by meshing with a second toothed part formed by an edge of the outer tube. The annular end cap with a toothed structure allows only a simple cutting process on raw material to be performed in order to obtain the annular end cap and the first toothed part formed at the outer edge thereof, thereby avoiding complex punching, spinning and similar processes, and saving production costs.

9 Claims, 5 Drawing Sheets

(56) References Cited

U.S. PATENT DOCUMENTS

2012/0019249 A1* 1/2012 Kruip ................. G01R 33/3802
                                                        324/318
2012/0075045 A1   3/2012 Calvert
2013/0093266 A1*  4/2013 Hong .................... H02K 33/18
                                                        310/15

* cited by examiner

THERMAL RADIATION SHIELD FOR SUPERCONDUCTING MAGNET, SUPERCONDUCTING MAGNET AND MAGNETIC RESONANCE IMAGING DEVICE

BACKGROUND OF THE INVENTION

Field of the Invention

The present invention concerns low-temperature superconducting technology, in particular a thermal radiation shield for a superconducting magnet, and a superconducting magnet and a magnetic resonance imaging apparatus with such a shield.

Description of the Prior Art

In superconductive magnetic resonance imaging (MRI), selected dipoles in a subject are excited and a magnetic resonance signal emitted by the dipoles is received, so as to generate an image based on the magnetic resonance signal. To encourage excitation of the selected dipoles in the subject, a strong uniform magnetic field is needed. The strong uniform magnetic field can be generated by a superconducting magnet coil operating at low temperature. To thermally isolate the superconducting magnet coil, and protect it from interference from heat in forms such as conduction, convection and radiation in the surrounding environment, the superconducting magnet must be thermally isolated using a thermal radiation shield.

A thermal radiation shield comprises a cylindrical inner tube and a cylindrical outer tube arranged around the periphery of the inner tube, as well as an annular end cap which is disposed between the inner tube and the outer tube and is connected in a fixed manner to both the inner tube and the outer tube. To obtain better heat conduction characteristics, the material chosen for the outer tube is often soft, such as aluminum metal, but the annular end cap then needs to be able to provide the necessary support for the outer tube, in order to prevent the outer tube from being deformed under the action of external forces, such as electromagnetic forces.

In the prior art, a decorative border structure is generally provided at an outer edge of the annular end cap, for fitting to the outer tube, so as to provide the necessary support for the outer tube at the same time as the decorative border structure is fitted to the outer tube. However, shaping of the decorative border structure requires the use of punching, spinning and similar processes, and when shaping is complete, it is still necessary to perform additional machining processes such as milling, thus the processing is complex, and the time costs and process costs of the thermal radiation shield are high.

SUMMARY OF THE INVENTION

In view of the above, the present invention provides a thermal radiation shield for a superconducting magnet, a superconducting magnet and a magnetic resonance imaging device, for the purpose of solving the technical problem in the prior art that the time costs and process costs of the thermal radiation shield are high.

According to an embodiment of the present invention, a thermal radiation shield for a superconducting magnet has an inner tube, an outer tube arranged around the periphery of the inner tube, an annular end cap disposed between the inner tube and the outer tube, the annular end cap comprising an inner edge and an outer edge, the inner edge being connected in a fixed manner to an edge of the inner tube, and a first toothed part is formed on the outer edge, and a second toothed part is formed on an edge of the outer tube, the first toothed part being connected by meshing with the second toothed part.

In an embodiment of the present invention, a chamfer is formed on a tooth edge of the second toothed part.

In an embodiment of the present invention, a recess is formed in a tooth top of the first toothed part.

In an embodiment of the present invention, a tooth trough width of the second toothed part is greater than a tooth width of the first toothed part.

In an embodiment of the present invention, the annular end cap is planar.

In an embodiment of the present invention, the annular end cap is conical.

In an advantageous embodiment of the present invention, the inner edge is connected to an edge of the inner tube by welding.

In an embodiment of the present invention, a third toothed part is formed on the inner edge, and a fourth toothed part is formed on an edge of the inner tube, the third toothed part being connected by meshing with the fourth toothed part.

The present invention also provides a superconducting magnet, having the thermal radiation shield of the various embodiments above.

The present invention also provides a magnetic resonance imaging device, having the superconducting magnet with the shield of the embodiments above.

Since the annular end cap of the thermal radiation shield according got the invention has a toothed structure instead of a decorative border structure as in the prior art, it is only necessary to perform a simple cutting process on raw material in order to obtain the annular end cap and the first toothed part formed at the outer edge thereof, thereby avoiding complex punching, spinning and similar processes, and saving process costs and time costs.

DESCRIPTION OF THE PREFERRED EMBODIMENTS

Figure 1:
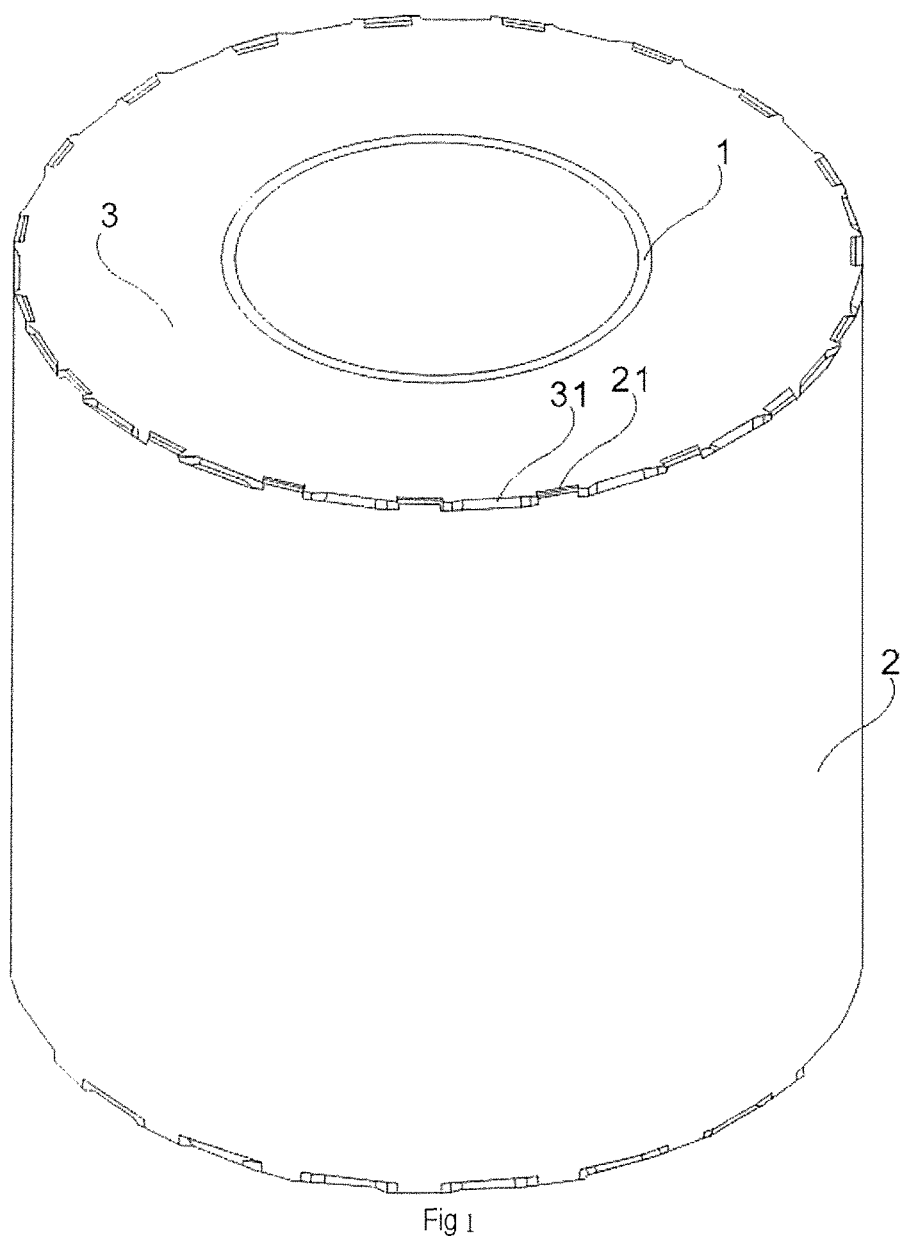
FIG. 1 is a schematic illustration of the structure of a thermal radiation shield for a superconducting magnet in an embodiment of the present invention.

FIG. 1 schematically shows a thermal radiation shield for a superconducting magnet provided in an embodiment of the present invention, having an inner tube 1, an outer tube 2 and an annular end cap 3.

The outer tube 2 is arranged around the periphery of the inner tube 1; specifically, both the outer tube 2 and the inner tube 1 are cylindrical, and the diameter of the outer tube 2 is greater than the diameter of the inner tube 1, so that the outer tube 2 can be arranged around the periphery of the inner tube 1. Generally, in order to obtain better heat conduction performance, the outer tube 2 can be made by processing aluminum metal, so that the mechanical performance of the outer tube 2 is poor, in other words, the material of the outer tube 2 is soft, and readily deforms under the action of external forces.

Since the outer tube 2 is readily acted on by external forces such as electromagnetic forces during use, and the mechanical performance of the outer tube 2 is poor, the outer tube 2 needs to be supported in order to avoid deformation thereof.

In this embodiment, a first toothed part 31 is formed on an outer edge of the annular end cap 3, while a second toothed part 21 is formed on an edge of the outer tube 2. The first toothed part 31 of the annular end cap 3 and the second toothed part 21 of the outer tube 2 are connected by meshing.

The second toothed part 21 and the first toothed part 31 complement each other, thereby being able to achieve the connection of the outer tube 2 and the annular end cap 3 by meshing. Meanwhile, the first toothed part 31 of the annular end cap 3 can provide effective support for the outer tube 2, thereby avoiding deformation of the outer tube 2 under the action of external forces such as electromagnetic forces. Furthermore, since the annular end cap 3 employs a toothed structure instead of a decorative border structure, it is only necessary to perform a simple cutting process on raw material, for example: the annular end cap 3 and the first toothed part 31 formed at the outer edge thereof can be obtained by laser cutting, thereby avoiding complex punching, spinning and similar processes, and saving process costs and time costs.

Similarly, it is only necessary to perform a simple cutting process on the raw material of the outer tube 2, for example: the outer tube 2 and the second toothed part 21 formed at the outer edge thereof can be obtained by laser cutting. Specifically, cutting may be performed on the raw material, to obtain a rectangle of material; further cutting is then performed at the two longer sides of the rectangle, to obtain the second toothed parts 21; the rectangle of material is rolled up, and processed to form a cylinder such that the two shorter sides of the rectangle coincide; finally, fixing by welding is performed at the position of coincidence of the two shorter sides, to obtain the outer tube 2.

In a possible form of implementation, the second toothed part 21 and the first toothed part 31 have equal numbers of teeth. Moreover, the tooth trough width of the second toothed part 21 is equal to the tooth width of the first toothed part 31, or the tooth width of the second toothed part 21 is equal to the tooth trough width of the first toothed part 31.

In the course of fitting the outer tube 2 to the annular end cap 3, since the second toothed part 21 formed by the edge of the outer tube 2 has a certain locating effect on the annular end cap, the process of alignment is avoided, saving assembly time.

Furthermore, to obtain better heat conduction performance, the junction between the outer tube 2 and the annular end cap 3 can be welded after the outer tube 2 and the annular end cap 3 have been connected by meshing, so as to obtain a low-resistance heat path.

In this embodiment, an inner edge of the annular end cap 3 is connected in a fixed manner to an edge of the inner tube 1; specifically, as FIG. 1 shows, in a possible form of implementation, the inner edge of the annular end cap 3 is welded to the edge of the inner tube 1. Alternatively, specifically, in another possible form of implementation, not marked in FIG. 1, the inner edge of the annular end cap 3 is meshed with the edge of the inner tube 1, in other words, a third toothed part is formed on the inner edge of the annular end cap 3, to be connected by meshing with a fourth toothed part formed by the edge of the inner tube 1.

In this embodiment, the thermal radiation shield for a superconducting magnet comprises an inner tube, an outer tube arranged around the periphery of the inner tube, and an annular end cap which is disposed between the inner tube and the outer tube and connected in a fixed manner to an edge of the inner tube by means of an inner edge of the annular end cap; and a first toothed part is formed at an outer edge of the annular end cap, the first toothed part being connected by meshing with a second toothed part formed by an edge of the outer tube. Since the annular end cap employs a toothed structure instead of a decorative border structure as in the prior art, it is only necessary to perform a simple cutting process on raw material in order to obtain the annular end cap and the first toothed part formed at the outer edge thereof, thereby avoiding complex punching, spinning and similar processes, and saving process costs and time costs.

Figure 2:
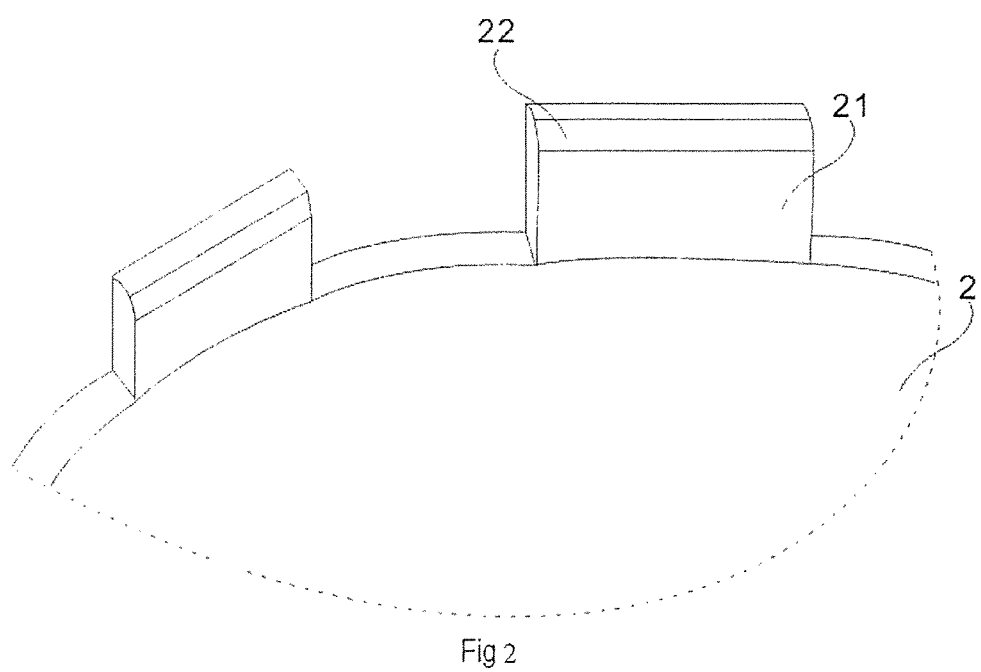
FIG. 2 is a schematic illustration of the structure of a chamfer in the outer tube 2 of the thermal radiation shield of FIG. 1.

Building upon the embodiment above, this embodiment provides a possible form of implementation, with chamfers 22 formed at tooth edges of the second toothed part 21 of the outer tube 2. FIG. 2 is a structural schematic diagram of a chamfer 22 in the outer tube 2; as FIG. 2 shows, specifically, a chamfer 22 is formed at an edge of a tooth of the second toothed part 21 of the outer tube 2, on that face of the tooth which faces the inner tube 1.

The chamfer may be 45°, 30° or 60°.

During processing of the annular end cap 3 and the outer tube 2, there will be a certain processing error and hence a certain error will occur in the matching of the annular end cap 3 to the outer tube 2; as a result, meshing of the annular end cap 3 with the outer tube 2 during assembly is difficult. Thus, by having a chamfer 22 formed at an edge of a tooth of the second toothed part 21 of the outer tube 2, on that face of the tooth which faces the inner tube 1, meshing of the annular end cap 3 and the outer tube 2 during assembly can be facilitated through the guiding action of the chamfer 22, significantly reducing the assembly time.

In this embodiment, the thermal radiation shield for a superconducting magnet comprises an inner tube, an outer tube arranged around the periphery of the inner tube, and an annular end cap which is disposed between the inner tube and the outer tube and connected in a fixed manner to an edge of the inner tube by means of an inner edge of the annular end cap; and a first toothed part is formed at an outer edge of the annular end cap, the first toothed part being connected by meshing with a second toothed part formed by an edge of the outer tube. Since the annular end cap employs a toothed structure instead of a decorative border structure as in the prior art, it is only necessary to perform a simple cutting process on raw material in order to obtain the annular end cap and the first toothed part formed at the outer edge thereof, thereby avoiding complex punching, spinning and similar processes, and saving process costs and time costs. Furthermore, a chamfer is formed on a tooth edge of the second toothed part of the outer tube, so that meshing of the annular end cap and the outer tube during assembly is facilitated through the guiding action of the chamfer, significantly reducing the assembly time.

Figure 3:
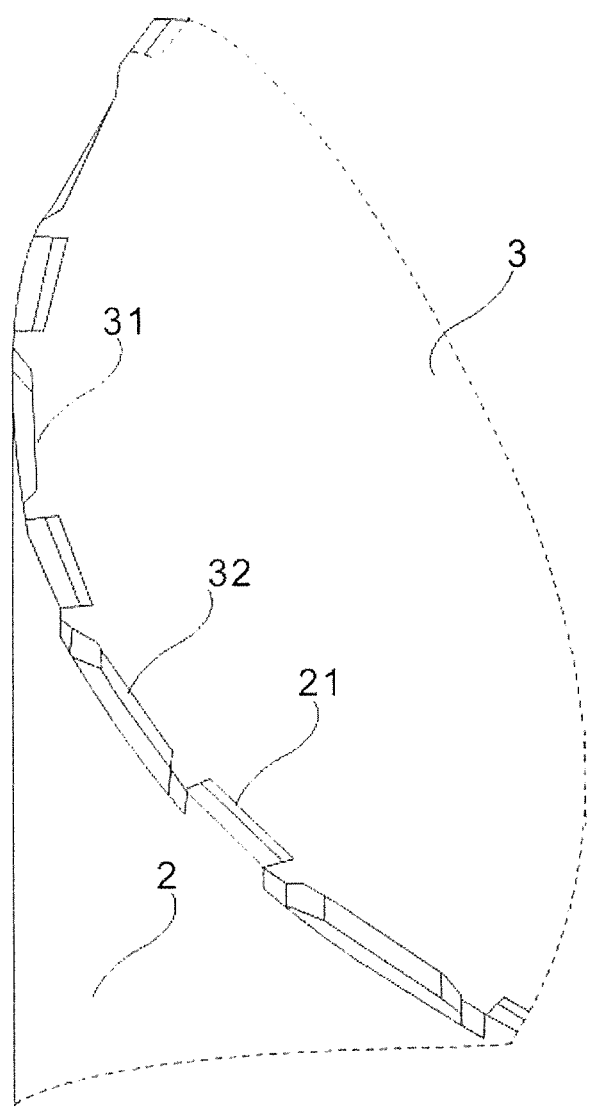
FIG. 3 is a structural schematic illustration showing meshing between the annular end cap and the outer tube of the thermal radiation shield of FIG. 1.

Building upon the embodiment shown in FIG. 1, a recess 32 for welding is provided at a tooth top of the first toothed part 31 formed by the outer edge of the annular end cap 3 in this embodiment. FIG. 3 is a structural schematic diagram of meshing between the annular end cap 3 and the outer tube 2; as FIG. 3 shows:

Since a recess 32 is provided at a tooth top of the first toothed part 31 in the annular end cap 3, a welding space will be formed in the recess 32 once the annular end cap 3 has been meshed with the outer tube 2; one face of the welding space is a bottom surface of the recess 32 of the first toothed part 31, another face is a surface of a tooth trough of the second toothed part 21, and these two faces are welded together. Thus, the recess 32 facilitates welding of the annular end cap 3 to the outer tube 2 once assembly is complete.

In this embodiment, the thermal radiation shield for a superconducting magnet comprises an inner tube, an outer tube arranged around the periphery of the inner tube, and an annular end cap which is disposed between the inner tube and the outer tube and connected in a fixed manner to an edge of the inner tube by means of an inner edge of the annular end cap; and a first toothed part is formed at an outer edge of the annular end cap, the first toothed part being connected by meshing with a second toothed part formed by an edge of the outer tube. Since the annular end cap employs a toothed structure instead of a decorative border structure as in the prior art, it is only necessary to perform a simple cutting process on raw material in order to obtain the annular end cap and the first toothed part formed at the outer edge thereof, thereby avoiding complex punching, spinning and similar processes, and saving process costs and time costs. Furthermore, a recess for welding is provided at a tooth top of the first toothed part formed by the outer edge of the annular end cap, facilitating welding of the annular end cap to the outer tube once assembly is complete.

Figure 4:
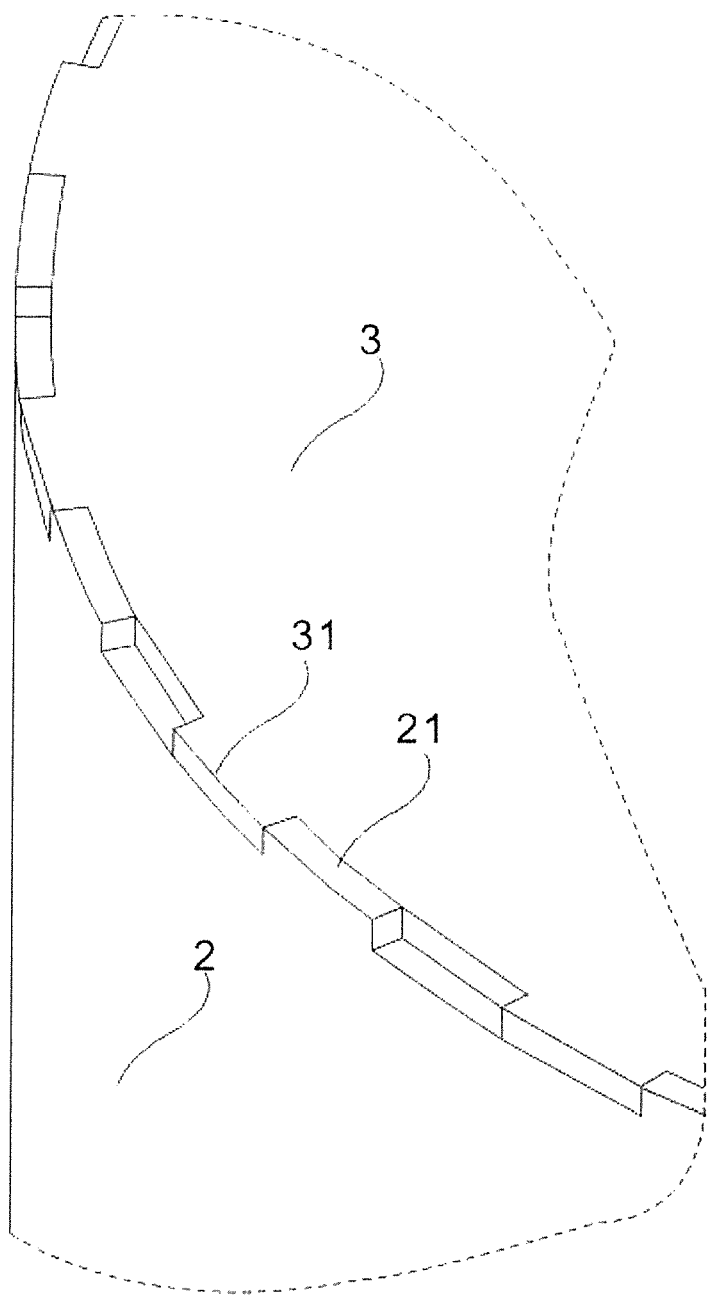
FIG. 4 is a schematic illustration showing another embodiment of meshing between the annular end cap and the outer tube of the thermal radiation shield of FIG. 1.

Building upon the embodiment shown in FIG. 1, a tooth trough width of the second toothed part 21 of the outer tube 2 is greater than a tooth width of the first toothed part 31 of the annular end cap 3 in this embodiment. FIG. 4 is another structural schematic diagram of meshing between the annular end cap 3 and the outer tube 2; as FIG. 4 shows:

A tooth trough width of the second toothed part 21 of the outer tube 2 is greater than a tooth width of the first toothed part 31 of the annular end cap 3, so that a welding space is formed in a tooth trough of the second toothed part 21 after the first toothed part 31 and the second toothed part 21 have been connected by meshing. One face of the welding space is a surface of a tooth trough of the first toothed part 31, another face is a surface of a tooth trough of the second toothed part 21, and these two faces are welded together. Thus, welding of the annular end cap 3 to the outer tube 2 once assembly is complete is facilitated.

In this embodiment, the thermal radiation shield for a superconducting magnet comprises an inner tube, an outer tube arranged around the periphery of the inner tube, and an annular end cap which is disposed between the inner tube and the outer tube and connected in a fixed manner to an edge of the inner tube by means of an inner edge of the annular end cap; and a first toothed part is formed at an outer edge of the annular end cap, the first toothed part being connected by meshing with a second toothed part formed by an edge of the outer tube. Since the annular end cap employs a toothed structure instead of a decorative border structure as in the prior art, it is only necessary to perform a simple cutting process on raw material in order to obtain the annular end cap and the first toothed part formed at the outer edge thereof, thereby avoiding complex punching, spinning and similar processes, and saving process costs and time costs. Furthermore, a tooth trough width of the second toothed part of the outer tube is greater than a tooth width of the first toothed part of the annular end cap, facilitating welding of the annular end cap to the outer tube once assembly is complete.

Figure 5:
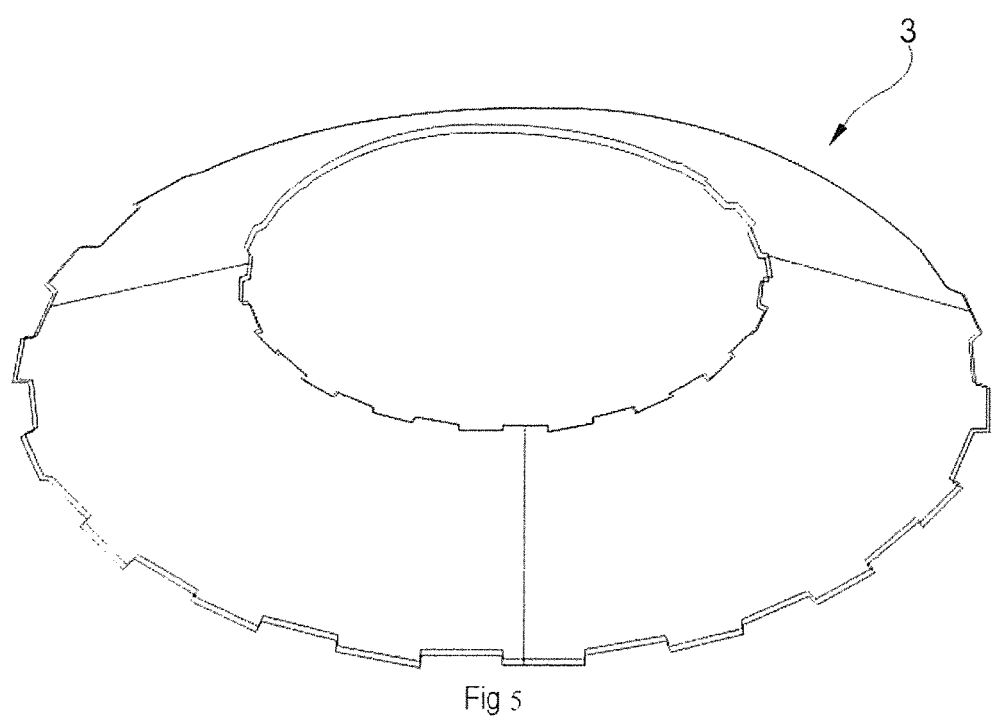
FIG. 5 is a schematic illustration of the structure of the annular end cap of the thermal radiation shield of FIG. 1.

In the embodiment shown in FIG. 1, the annular end cap 3 is a planar ring; this embodiment of the invention provides another possible form of implementation, in which the annular end cap 3 is a conical ring. FIG. 5 is a structural schematic diagram of the annular end cap 3; as FIG. 5 shows:

The annular end cap 3 is formed by piecing together three fan-shaped rolled plates. Specifically, cutting may be performed on raw material to obtain three identical fan-shaped pieces of material; further cutting is performed at an outer edge of the fan-shaped material to obtain the first toothed part 31. The fan-shaped material is then rolled to obtain a suitable curvature, so that the three fan-shaped rolled plates can be pieced together to form a conical ring.

Furthermore, optionally, further cutting may be performed at an inner edge of the fan shape to obtain a third toothed part 32. Correspondingly, a fourth toothed part 11 formed at an edge of the inner tube 1 is needed, so that the third toothed part 32 formed at the inner edge of the annular end cap 31 is connected by meshing with the fourth toothed part 11 formed by the edge of the inner tube 1.

Those skilled in the art will know that having the annular end cap 3 formed by piecing together three fan-shaped rolled plates merely serves as a preferred form of implementation; the annular end cap 3 is not restricted to being foamed by piecing together three fan-shaped rolled plates, but may be formed by piecing together a greater or a smaller number of fan-shaped rolled plates.

Since the arrangement of the superconducting magnet in certain situations does not allow the planar annular end cap 3 shown in FIG. 1 to be used, the conical annular end cap 3 in this embodiment of the invention may be used.

In this embodiment, the thermal radiation shield for a superconducting magnet comprises an inner tube, an outer tube arranged around the periphery of the inner tube, and an annular end cap which is disposed between the inner tube and the outer tube and connected in a fixed manner to an edge of the inner tube by means of an inner edge of the annular end cap; and a first toothed part is formed at an outer edge of the annular end cap, the first toothed part being connected by meshing with a second toothed part formed by an edge of the outer tube. Since the annular end cap employs a toothed structure instead of a decorative border structure as in the prior art, it is only necessary to perform a simple cutting process on raw material in order to obtain the annular end cap and the first toothed part formed at the outer edge thereof, thereby avoiding complex punching, spinning and similar processes, and saving process costs and time costs. Furthermore, the use of a conical annular end cap leaves more space inside the thermal radiation shield, which is more suitable for arranging the superconducting magnet.

Although modifications and changes may be suggested by those skilled in the art, it is the intention of the inventors to embody within the patent warranted hereon all changes and modifications as reasonably and properly come within the scope of their contribution to the art.

We claim as our invention:

1. A thermal radiation shield for a superconducting magnet comprising:
   an inner tube;
   an outer tube arranged around the periphery of the inner tube, a second toothed part being formed on an edge of the outer tube;
   an annular end cap disposed at an end of the thermal radiation shield, the annular end cap comprising, an inner edge, connected in a fixed manner to an edge of the inner tube, and an outer edge, on which a first toothed part is formed, the first toothed part being connected by meshing with the second toothed part;

a third toothed part formed on the inner edge of said annular end cap; and a fourth toothed part formed on an edge of the inner tube, the third toothed part being connected by meshing with the fourth toothed part.

2. The thermal radiation shield for a superconducting magnet as claimed in claim 1, wherein the second teeth toothed part has a chamfer formed on a tooth edge of the second toothed part.

3. The thermal radiation shield for a superconducting magnet as claimed in claim 1, wherein each top of each tooth of the first toothed part has a recess therein.

4. The thermal radiation shield for a superconducting magnet as claimed in claim 1, wherein a tooth trough width between successive teeth of the second toothed part is greater than a tooth width of each tooth of the first toothed part.

5. The thermal radiation shield for a superconducting magnet as claimed in claim 1, wherein the annular end cap is planar.

6. The thermal radiation shield for a superconducting magnet as claimed in claim 1, wherein the annular end cap is conical.

7. The thermal radiation shield for a superconducting magnet as claimed in claim 1 wherein the inner edge is connected to an edge of the inner tube by welding.

8. A superconducting magnet assembly comprising:

a superconducting magnet;

a thermal radiation shield at least partially surrounding said superconducting magnet;

said thermal radiation shield comprising an inner tube, an outer tube arranged around the periphery of the inner tube, a second toothed part being formed on an edge of the outer tube, an annular end cap disposed at an end of the thermal radiation shield, the annular end cap comprising, an inner edge, connected in a fixed manner to an edge of the inner tube, and an outer edge, on which a first toothed part is formed, the first toothed part being connected by meshing with the second toothed part;

a third toothed part formed on the inner edge of said annular end cap; and a fourth toothed part formed on an edge of the inner tube, the third toothed part being connected by meshing with the fourth toothed part.

9. A magnetic resonance imaging apparatus comprising:

a magnetic resonance scanner comprising a superconducting basic field magnet;

a thermal radiation shield at least partially surrounding said superconducting basic field magnet;

said thermal radiation shield comprising an inner tube, an outer tube arranged around the periphery of the inner tube, a second toothed part being formed on an edge of the outer tube, an annular end cap disposed at an end of the thermal radiation shield, the annular end cap comprising, an inner edge, connected in a fixed manner to an edge of the inner tube, and an outer edge, on which a first toothed part is formed, the first toothed part being connected by meshing with the second toothed part;

a third toothed part formed on the inner edge of said annular end cap; and a fourth toothed part formed on an edge of the inner tube, the third toothed part being connected by meshing with the fourth toothed part.

\* \* \* \* \*